(12) United States Patent
Mair et al.

(10) Patent No.: US 7,474,582 B2
(45) Date of Patent: Jan. 6, 2009

(54) SYSTEMS AND METHODS FOR MANAGING POWER

(75) Inventors: Hugh Thomas Mair, Fairview, TX (US); James Sangwon Song, Plano, TX (US); Franck Benjamin Dahan, Nice (FR); William Douglas Wilson, Dallas, TX (US); Norman LeRoy Culp, Dallas, TX (US); Sudha Thiruvengadam, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 19 days.

(21) Appl. No.: 11/637,352

(22) Filed: Dec. 12, 2006

(65) Prior Publication Data

US 2008/0137444 A1   Jun. 12, 2008

(51) Int. Cl.
  *G11C 5/14* (2006.01)
  *G11C 11/00* (2006.01)
  *G11C 7/06* (2006.01)
(52) U.S. Cl. .................. 365/226; 365/154; 365/189.07; 365/189.09
(58) Field of Classification Search ............ 365/189.07, 365/189.09, 226, 154, 155, 156
See application file for complete search history.

(56) References Cited

U.S. PATENT DOCUMENTS

| | | | | |
|---|---|---|---|---|
| 5,373,477 A | * | 12/1994 | Sugibayashi | 365/226 |
| 5,541,880 A | * | 7/1996 | Campardo et al. | 365/189.09 |
| 5,563,499 A | | 10/1996 | Pinney | |
| 6,052,325 A | * | 4/2000 | Merritt | 365/226 |
| 6,385,115 B1 | * | 5/2002 | Nakai | 365/226 |
| 6,795,355 B2 | * | 9/2004 | Ooishi | 365/201 |
| 7,072,238 B2 | * | 7/2006 | Chae et al. | 365/226 |
| 2004/0017690 A1 | * | 1/2004 | Lee et al. | 365/145 |
| 2004/0120192 A1 | * | 6/2004 | Kitagawa et al. | 365/189.09 |
| 2004/0233716 A1 | | 11/2004 | Tran et al. | |
| 2006/0013030 A1 | * | 1/2006 | Arimoto et al. | 365/63 |
| 2007/0014176 A1 | * | 1/2007 | Krenzke et al. | 365/226 |
| 2007/0024731 A1 | * | 2/2007 | Muramatsu et al. | 348/308 |

OTHER PUBLICATIONS

Publication entitled: "Power Saving With a Dual Rail SRAM from NanoAmp Solutions"; Dual Rail Advantages, Feb. 2006, 2 pages.

\* cited by examiner

*Primary Examiner*—Ly D Pham
(74) *Attorney, Agent, or Firm*—Ronald O. Neerings; Wade James Brady, III; Frederick J. Telecky, Jr.

(57) ABSTRACT

One embodiment of the present invention includes a system for managing power of a memory array. The system comprises a comparator configured to compare a first voltage with a reference voltage. The first voltage can correspond to an operating voltage of at least one of a peripheral circuit associated with the memory array and a logic circuit configured to communicate with the peripheral circuit. The reference voltage can correspond to a minimum threshold voltage for read/write operations of the memory array. The system also comprises an output circuit configured to provide an output voltage to the memory array in response to an output of the comparator. The output voltage can be the greater of the operating voltage of the at least one of the peripheral circuit and the logic circuit and the minimum threshold voltage.

21 Claims, 3 Drawing Sheets

SYSTEMS AND METHODS FOR MANAGING POWER

TECHNICAL FIELD

This invention relates to electronic circuits, and more specifically to systems and methods for managing power for power managed devices, such as a memory array.

BACKGROUND

Static random access memory (SRAM) is a type of RAM that uses transistor driven memory cells to latch bits of data for memory storage and is used in a large variety of consumer electronics, such as computers and cellular telephones. Memory cells in an SRAM circuit are typically arranged in an array, such that the SRAM includes individually addressable rows and columns to which data can be written and from which data can be read. The individually addressable rows and columns are controlled by peripheral circuitry that receives decoded signals from associated logic circuitry that correspond to memory locations, which could be generated from a processor, such that the peripheral circuitry determines which of the memory cells in the array are accessed for read and write operations at any given time. While data is being transferred to and from an SRAM circuit, the SRAM is considered to be in an active mode, such that all of the memory cells in the array are receiving power and are capable of freely allowing data transfer to and from the memory cells.

The market for consumer electronics, however, is constantly improving. There is an increasing demand for smaller circuit packages that operate at increased speeds and consume less power for the purpose of conserving battery-life, such as in wireless communication applications. To achieve greater speeds, a typical SRAM may operate at an increased voltage potential. However, prolonged increased voltage operation creates an increased demand on the power supply, thus shortening battery life. Accordingly, a typical SRAM may be configured to lower the operating voltage during less memory intensive operation. However, as SRAM transistor gate-oxide sizes are designed to be smaller (e.g., 70 nm or smaller), the minimum threshold voltage of the memory array required for read/write operations may be higher than a desired operating voltage of the peripheral circuitry and the associated logic circuitry during less memory intensive operation. Some SRAM arrays can be configured to receive separate power supplies for the peripheral circuitry and for the memory array. However, such implementations can require an additional pin on the memory chip and additional circuitry overhead in the associated electronic device, and can also restrict the dynamic voltage range of the peripheral and the associated logic circuitry.

SUMMARY

One embodiment of the present invention includes a system for managing power of a memory array. The system comprises a comparator configured to compare a first voltage with a reference voltage. The first voltage can correspond to an operating voltage of at least one of a peripheral circuit associated with the memory array and a logic circuit configured to communicate with the peripheral circuit. The reference voltage can correspond to a minimum threshold voltage for read/write operations of the memory array. The system also comprises an output circuit configured to provide an output voltage to the memory array in response to an output of the comparator. The output voltage can be the greater of the operating voltage of the at least one of the peripheral circuit and the logic circuit and the minimum threshold voltage.

Another embodiment of the present invention includes a method for managing power of a memory array. The method comprises comparing a first voltage with a reference voltage. The first voltage can correspond to an operating voltage of at least one of a peripheral circuit associated with the memory array and a logic circuit configured to communicate with the peripheral circuit. The reference voltage can correspond to a minimum threshold voltage for read/write operations of the memory array. The method also comprises providing a memory supply voltage to the memory array in response to the comparison of the first voltage and the reference voltage. The memory supply voltage can be the greater of the operating voltage of the at least one of the peripheral circuit and the logic circuit and the minimum threshold voltage.

Another embodiment of the present invention includes a system for managing power of a memory array. The system comprises means for comparing a first voltage with a reference voltage. The first voltage can correspond to an operating voltage of at least one of a peripheral circuit associated with the memory array and a logic circuit configured to communicate with the peripheral circuit. The reference voltage can correspond to a minimum threshold voltage for read/write operations of the memory array. The system also comprises means for providing an output voltage to the memory array in response to the means for comparing. The output voltage can be the greater of the operating voltage of the at least one of the peripheral circuit and the logic circuit and the minimum threshold voltage.

DETAILED DESCRIPTION

The present invention relates to electronic circuits, and more specifically to systems and methods for managing power for power managed devices, such as one or more memory arrays. A memory circuit can include a power management system. The power management system can receive a reference voltage and a logic voltage as inputs. The logic voltage can be an operational voltage of peripheral and associated logic circuitry. The reference voltage can be a voltage that is a minimum threshold voltage for read/write operations of the memory array. The power management system can compare the reference voltage and the logic voltage and output the greater of the two to the memory array in an active mode of operation. In a retention mode of operation, the power management system can output a retention voltage, which can be a voltage that is less than the minimum threshold voltage for read/write operations of the memory array but is sufficient to store data in the memory cells.

Figure 1:
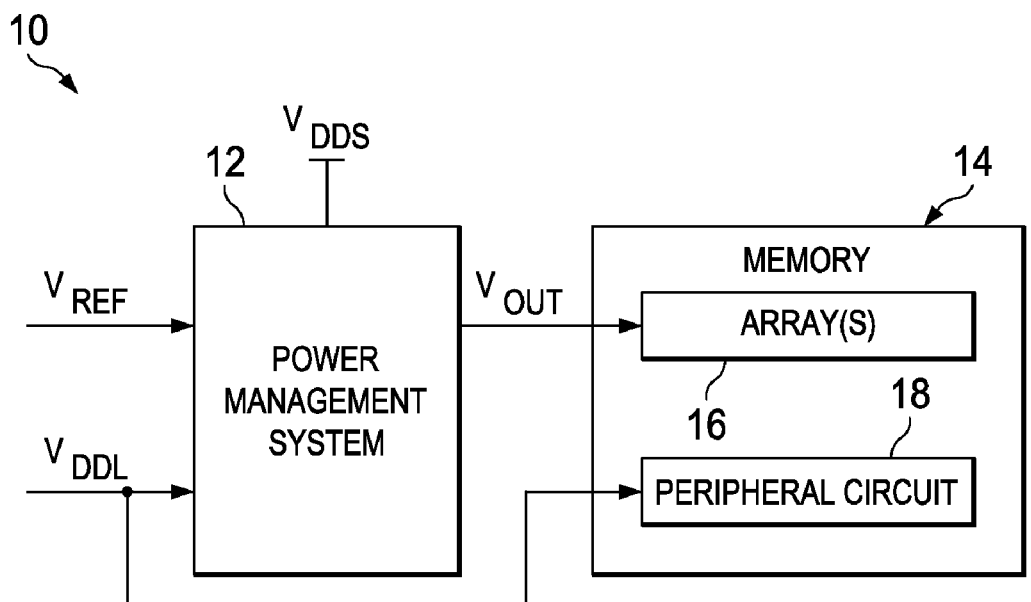
FIG. 1 illustrates an example of a memory system in accordance with an aspect of the invention.

FIG. 1 illustrates an example of a memory system 10 in accordance with an aspect of the invention. The memory system 10 can be included in a static random access memory (SRAM). The memory system 10 includes a power management system 12. The power management system 12 can be configured to provide power to a memory 14. The memory 14 includes at least one memory array 16 and a peripheral circuit 18. As an example, the memory array 16 can be an array of memory cells organized into memory rows and memory columns. It is to be understood that, although the discussion regarding the example of FIG. 1 is with reference to a single memory array 16, the memory 14 can include a plurality of memory arrays 16. The peripheral circuit 18 can include logic configured to interpret and decode signals for the activation of memory rows and memory columns in the memory array 16 for read/write operations. As an example, the decode signals can be generated by associated logic circuitry (not shown) that can provide an interface between one or more processors and the memory 14.

The power management system 12 can receive positive supply voltage $V_{DDS}$, a reference voltage $V_{REF}$, and a logic voltage $V_{DDL}$. As an example, the positive supply voltage $V_{DDS}$ can be an existing on-chip DC voltage, such that the positive supply voltage $V_{DDS}$ can provide a substantially fixed predetermined voltage to other components on the integrated circuit (IC) that includes the memory system 10. For example, the positive supply voltage $V_{DDS}$ can be an input/output (I/O) voltage of approximately 1.8V that provides power to an I/O component of the IC on which the memory system 10 is implemented. The power management system 12 provides a memory array supply voltage $V_{OUT}$ that varies based on the reference voltage $V_{REF}$ and the logic voltage $V_{DDL}$.

The logic voltage $V_{DDL}$ can be an operational voltage of the peripheral circuit 18 and can also be an operational voltage of associated logic circuitry. As such, in the example of FIG. 1, the logic $V_{DDL}$ is input to both the power management system 12 and the peripheral circuit 18. The logic voltage $V_{DDL}$ can be a dynamic voltage that can be adjusted based on a mode of operation of the memory 14. For example, for less intensive memory access operations, such that memory need not be accessed quickly, the logic voltage $V_{DDL}$ can be set to a lower voltage (e.g., approximately 0.9V), such as to reduce power consumption. The logic voltage $V_{DDL}$ can also be set to a lower voltage upon the memory 14 being set for a retention mode. However, during more intensive memory access operations, such as video streaming for a camera-phone, the logic voltage $V_{DDL}$ can be set to a higher voltage (e.g., approximately 1.35V) for faster read/write access to the memory array 16. In addition, the logic voltage $V_{DDL}$ can be set for an intermediate voltage potential, as may be dictated by the memory access application.

The reference voltage $V_{REF}$ can be a substantially fixed DC voltage that is set for a minimum threshold for read/write operations of the memory array 16 in an active mode of operation. For example, for small geometry transistors having a gate size of approximately 65 nm, a minimum threshold voltage for the memory array 16 for read/write operations can be approximately 1.2V. Thus, the reference voltage $V_{REF}$ can be a voltage that is approximately equal to a minimum threshold voltage of operation for the memory array 16 (e.g., 1.2V). Alternatively, the reference voltage $V_{REF}$ can be a fractionally scaled version of the minimum threshold of operation for the memory array 16, such as approximately 0.5V. For example, the reference voltage $V_{REF}$ can be a voltage that is generated, for example, from a band-gap voltage source. The scaled minimum threshold voltage can be compared with a scaled version of the logic voltage $V_{DDL}$, such as will be explained in greater detail in the example of FIG. 2 below.

Similar to as explained above regarding the peripheral circuit 18, the memory array 16 can implement a higher voltage for faster memory access operations. For example, upon the memory array 16 operating at an elevated voltage potential, and thus with increased power, the memory cell transistors can be switched faster for more rapid read/write operations. As such, the memory array supply voltage $V_{OUT}$ generated by the power management system 12 is dynamic. For example, the power management system 12 can be configured to adjust the memory array supply voltage $V_{OUT}$ based on a mode of operation of the memory 14.

To generate the memory array supply voltage $V_{OUT}$, the power management system 12 can compare the reference voltage $V_{REF}$ and the logic voltage $V_{DDL}$. As an example, the reference voltage $V_{REF}$ can be a minimum threshold voltage for read/write operations of the memory array 16, and is thus directly compared with the logic voltage $V_{DDL}$. Upon the reference voltage $V_{REF}$ being greater than the logic voltage $V_{DDL}$, for example, as a result of less intensive memory access operations, the power management system 12 can provide the memory supply voltage $V_{OUT}$ at a voltage that is approximately equal to the minimum threshold voltage of operation for the memory array 16. As such, operational power of the memory system 10 can be conserved during less intensive memory access operations by setting the logic voltage $V_{DDL}$ to a reduced voltage while still maintaining read/write capability of the memory array 16. However, if the logic voltage $V_{DDL}$ is greater than the reference voltage $V_{REF}$, for example, as a result of more intensive memory access operations, the power management system 12 can provide the memory supply voltage $V_{OUT}$ at a voltage that is approximately equal to the logic voltage $V_{DDL}$. As such, the memory 14 can operate at an increased speed due to a greater voltage of both the peripheral circuit 18 and the memory array 16. Therefore, the power management system 12 provides the memory supply voltage $V_{OUT}$ that is the greater of the reference voltage $V_{REF}$ and the logic voltage $V_{DDL}$, such that the power management system 12 acts as a low drop-out (LDO) power regulator with respect to the reference voltage $V_{REF}$.

The power management system 12 can provide the memory supply voltage $V_{OUT}$ by scaling-down the positive supply voltage $V_{DDS}$. As an example, the power management system 12 can provide a bias current to a transistor to operate the transistor in a linear mode of operation. As such, the scaling-down of the positive supply voltage $V_{DDS}$ to generate the memory array supply voltage $V_{OUT}$ can be linearly proportional. In addition, because the positive supply voltage $V_{DDS}$ can be an existing on-chip power supply, the power management system 12 can provide the memory array supply voltage $V_{OUT}$ that is independent from the logic voltage $V_{DDL}$ without having to provide separate power supplies for both the peripheral circuit 18 and the memory array 16 on the IC in which the memory system 10 is included.

As described above, in an active mode of operation, the memory 14 accesses memory cells from the memory array 16 for read/write operations. However, in a retention mode of operation, memory cells in the memory array 16 are not accessed, but are provided with a supply voltage that is sufficient to store the data in the memory cells for later access. The switching between the active mode of operation and the retention mode of operation can occur, for example, as a result of a signal generated from a memory controller (not shown). The supply voltage sufficient to store data in the memory cells can be less than the minimum threshold voltage for accessing the memory cells for read/write operations, and thus can be less than the reference voltage $V_{REF}$. As such, power consumption in the memory 14 can be reduced by supplying a lower voltage to the memory array 16. Therefore, the power management system 12 can provide the memory array supply voltage $V_{OUT}$ at a retention mode voltage (e.g., approximately 1.0V) that is less than the reference voltage $V_{REF}$.

It is to be understood that the memory system 10 is not intended to be limited to the example of FIG. 1. For example, one or more components of a typical memory IC have been omitted from the example of FIG. 1 for the sake of simplicity of explanation. As another example, the memory system 10 can be included in an application specific integrated circuit (ASIC), such that the memory system 10 can be interfaced with other integrated components, as well. Furthermore, for a memory 14 having a plurality of memory arrays 16, the power management system 12 can provide the memory array supply voltage $V_{OUT}$ to each of the plurality of memory arrays or to a subset of the plurality of memory arrays 16, such that one or more of the memory arrays 16 can be provided with a supply voltage from another source. As another example, the memory system 10 can include a plurality of power management systems 12, such that each can independently regulate power for one or more memory arrays 16.

Figure 2:
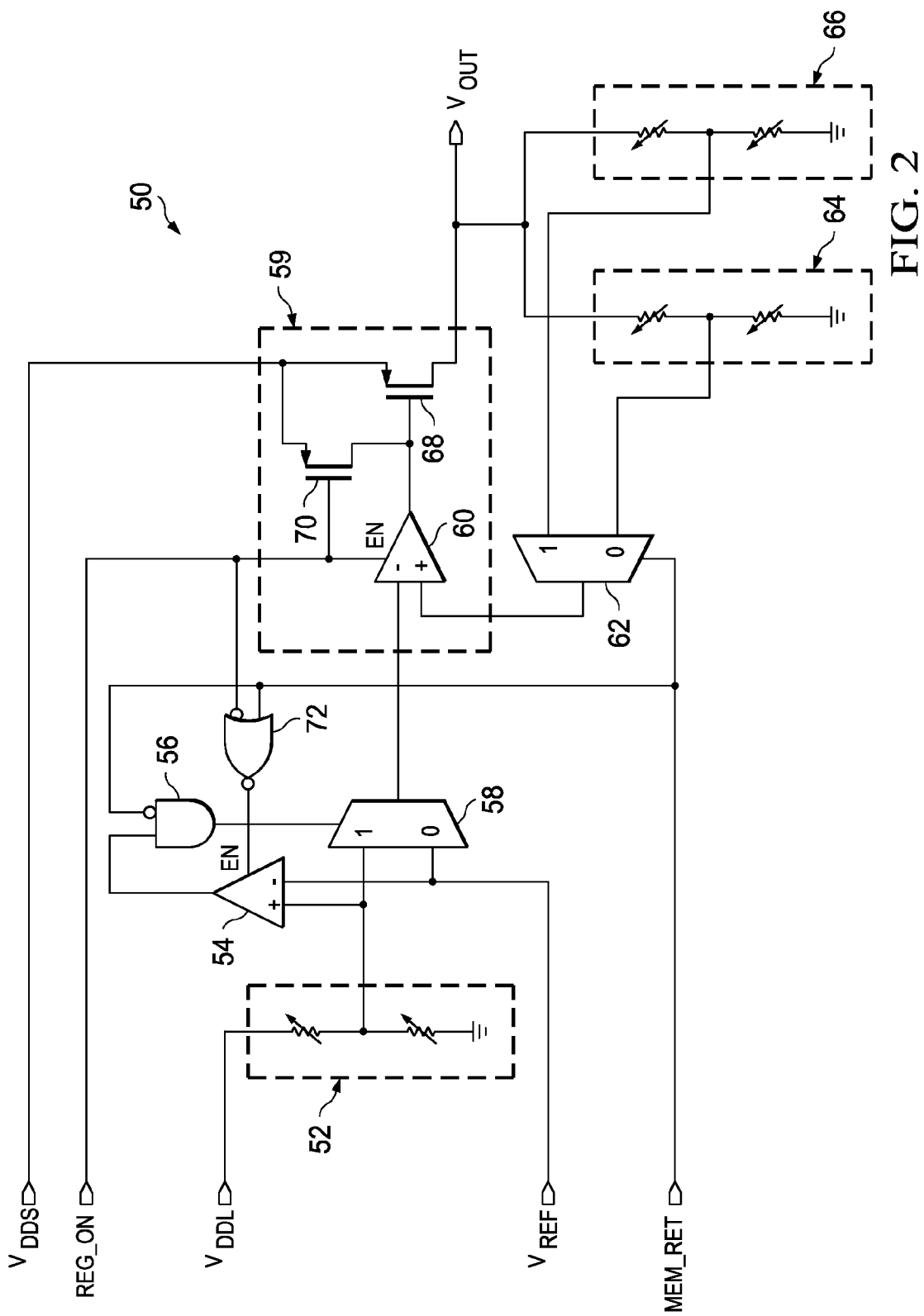
FIG. 2 illustrates an example of a power management system for a memory array in accordance with an aspect of the invention.

FIG. 2 illustrates an example of a power management system 50 for a memory array in accordance with an aspect of the invention. As an example, the power management system 50 can be the power management system 12 described in the example of FIG. 1 above. Thus, the power management system 50 can provide an output voltage $V_{OUT}$ to one or more memory arrays, such as including the memory array 16 in the example of FIG. 1. The power management system 50 receives a logic signal REG_ON and a logic signal MEM_RET as inputs. As will be explained in greater detail below, the logic signal REG_ON is an enable signal for the power management system 50, and the logic signal MEM_RET is a signal that controls the power management system 50 between a retention mode and an active mode. The logic signal REG_ON and the logic signal MEM_RET can be signals generated, for example, from a memory controller (not shown).

In addition, the power management system 50 receives a positive supply voltage $V_{DDS}$, a reference voltage $V_{REF}$, and a logic voltage $V_{DDL}$. As an example, the positive supply voltage $V_{DDS}$ can be an existing substantially fixed on-chip DC voltage configured and intended to provide power to at least one other component on the IC that includes the power management system 50. For example, the positive supply voltage $V_{DDS}$ can be an I/O voltage of approximately 1.8V. The logic voltage $V_{DDL}$ can be a dynamic operational voltage of a peripheral circuit and/or associated logic circuitry. For example, during more intensive memory access operations, the logic voltage $V_{DDL}$ can be set to a higher voltage (e.g., approximately 1.35V), and for less intensive memory access operations, the logic voltage $V_{DDL}$ can be set to a lower voltage (e.g., approximately 0.9V). As such, the logic voltage $V_{DDL}$ can vary between approximately 0.9V and approximately 1.35V depending on the desired level of intensity of read/write access to the at least one associated memory array.

In the example of FIG. 2, the reference voltage $V_{REF}$ is a voltage that corresponds to a minimum threshold of operation for a memory array in an active mode of operation. The reference voltage $V_{REF}$ can be a voltage that is generated, for example, from a band-gap voltage source. In the example of FIG. 2, the reference voltage $V_{REF}$ can have a voltage that is a fractionally scaled version of the minimum threshold voltage of operation for a memory array. For example, the reference voltage $V_{REF}$ can have a fractionally scaled voltage of approximately 0.5V in providing a reference to a minimum threshold voltage of approximately 1.2V for read/write operations of a memory array in active mode.

The power management system 50 includes a voltage divider 52 and a comparator 54. The voltage divider 52 fractionally scales the logic voltage $V_{DDL}$ by an amount approximately equal to the fractional scaling of the reference voltage $V_{REF}$ relative to the minimum threshold voltage for a memory array in an active mode. For example, the voltage divider 52 can apply an approximately 42% scale factor to the logic voltage $V_{DDL}$ based on a reference voltage fractionally scaled from about 1.2V, the minimum threshold voltage for read/write operations of a memory array in active mode, to about 0.5V. The comparator 54 receives the fractionally scaled logic voltage $V_{DDL}$ and the reference voltage $V_{REF}$ as inputs. Because of the fractional scaling of the logic voltage $V_{DDL}$ by the voltage divider 52, the fractionally scaled logic voltage $V_{DDL}$ and the reference voltage $V_{REF}$ are normalized with respect to each other for comparison by the comparator 54.

The comparator 54 provides a logic output that is indicative of which of the reference voltage $V_{REF}$ and the fractionally scaled logic voltage $V_{DDL}$ is greater. In the example of FIG. 2, the comparator 54 provides a logic high value upon the fractionally scaled logic voltage $V_{DDL}$ being greater and a logic low value upon the reference voltage $V_{REF}$ being greater. The logic output of the comparator 54 is provided to an input of an AND-gate 56. The AND-gate 56 also receives the logic signal MEM_RET at an inverted input. The output of the AND-gate 56 is coupled to a multiplexer 58 that is configured to select between the fractionally scaled logic voltage $V_{DDL}$ and the reference voltage $V_{REF}$ based on the logic signal output from the AND-gate 56. In the example of FIG. 2, the multiplexer 58 outputs the fractionally scaled logic voltage $V_{DDL}$ upon the output of the AND-gate 56 being logic high, resulting from the fractionally scaled logic voltage $V_{DDL}$ being greater than the reference voltage $V_{REF}$. The multiplexer 58 outputs the reference voltage $V_{REF}$ upon the output of the AND-gate 56 being logic low, resulting from the reference voltage $V_{REF}$ being greater than the fractionally scaled logic voltage $V_{DDL}$ or the logic signal MEM_RET being logic high based on the power management system 50 being switched to the retention mode.

The power management system 50 includes an output circuit 59 that provides the output voltage $V_{OUT}$ to the at least one associated memory array. In the example of FIG. 2, the output circuit 59 includes an operational amplifier 60. The multiplexer 58 provides the appropriate output voltage to an inverting input of the operational amplifier 60. The operational amplifier 60 also receives a voltage output from a multiplexer 62. The multiplexer 62 receives inputs from an active mode voltage divider 64 and a retention mode voltage divider 66, respectively. Both the active mode voltage divider 64 and the retention mode voltage divider 66 are configured to fractionally scale the output voltage $V_{OUT}$, such that the fractionally scaled voltage potentials, respectively, are normalized with the fractionally scaled logic voltage $V_{DDL}$ and the reference voltage $V_{REF}$. For example, the active mode voltage divider 64 can apply the same scale factor (e.g., approximately 42%) as the voltage divider 52, and the retention mode voltage divider 66 can apply a scale factor to fractionally scale a retention mode voltage (e.g., approximately 1.0V) to be normalized with respect to the fractionally scaled logic voltage $V_{DDL}$ and the reference voltage $V_{REF}$. The multiplexer 62 switches between the voltage potentials output from the active mode voltage divider 64 and the retention mode voltage divider 66 based on the logic signal MEM_RET. For example, if the logic signal MEM_RET is logic high, the power management system 50 is set for the retention mode, and the multiplexer 62 outputs the voltage from the retention mode voltage divider 66. Conversely, if the logic signal MEM_RET is logic low, the power management system 50 is set for the active mode, and the multiplexer 62 outputs the voltage from the active mode voltage divider 64.

The operational amplifier 60 provides a variable output based on the relative voltages applied at its inputs. The variable output of the operational amplifier 60 is provided to a gate terminal of a P-type field effect transistor (FET) 68. The P-FET 68 receives the positive supply voltage $V_{DDS}$ at a source terminal and provides the output voltage $V_{OUT}$ at a drain terminal. The variable output of the operational amplifier 60 can operate the P-FET 68 in a linear mode. As such, the P-FET 68 scales the positive supply voltage $V_{DDS}$ to provide the output voltage $V_{OUT}$. Therefore, based on the inputs provided to the operational amplifier 60, the P-FET 68 can be biased to provide the output voltage $V_{OUT}$ that corresponds to the greater of the minimum threshold voltage for a memory array and the logic voltage $V_{DDL}$ in the active mode, or can provide the output voltage $V_{OUT}$ that is a retention mode voltage in the retention mode. For example, if the power management system 50 is set for the active mode, the P-FET 68 can scale-down the positive supply voltage $V_{DDS}$ from approximately 1.8V to approximately 1.2V upon the reference voltage $V_{REF}$ being greater than the fractionally scaled logic voltage $V_{DDL}$, or to the logic voltage $V_{DDL}$, upon the fractionally scaled logic voltage $V_{DDL}$ being greater than the reference voltage $V_{REF}$. Conversely, if the power management system 50 is set for the retention mode, the P-FET 68 can scale-down the positive supply voltage $V_{DDS}$ from approximately 1.8V to the retention mode voltage (e.g., approximately 1.0V), regardless of the relative values of the reference voltage $V_{REF}$ and the fractionally scaled logic voltage $V_{DDL}$. As such, in the active mode, the transistors in an associated memory array can be provided with a voltage sufficient for read/write operations while the peripheral and associated logic circuitry operates at a reduced voltage to reduce power consumption. Also in the active mode, the transistors in the associated memory array can be provided with an elevated voltage that is approximately equal to that of the logic voltage $V_{DDL}$ to provide for faster read/write operations of the memory array.

The logic signal REG_ON can be a signal that is asserted to enable operation of the power management system 50. In the example of FIG. 2, the logic signal REG_ON is provided to an enable input (EN) of the operational amplifier 60, such that the operational amplifier 60 is disabled upon the logic signal REG_ON switched to a logic low state. In addition, the logic signal REG_ON is coupled to a gate terminal of a P-FET 70 that is interconnected between the positive supply voltage $V_{DDS}$ and the output of the operational amplifier 60. As such, upon the logic signal REG_ON being switched to a logic low state, the P-FET 70 activates to couple the positive supply voltage $V_{DDS}$ to the gate of the P-FET 68, thus deactivating the P-FET 68. Furthermore, the logic signal REG_ON and the logic signal MEM_RET are coupled to an inverting input terminal and a non-inverting input terminal, respectively, of a NOR-gate 72. The NOR-gate 72 has an output coupled to an enable input EN of the comparator 54. Thus, the NOR-gate 72 is configured to disable the comparator 54 if the logic signal REG_ON is switched to a logic low state or the power management system 50 is switched to the retention mode.

It is to be understood that the power management system 50 is not limited to the example of FIG. 2. For example, additional components and signal interfaces can be included in the power management system 50. For example, a bypass voltage can be switched to the output voltage $V_{OUT}$ based on the state of an additional binary input. As such, a substantially fixed voltage can be applied to the associated memory array upon the occurrence of a certain predefined condition, as may be dictated by a given application.

Figure 3:
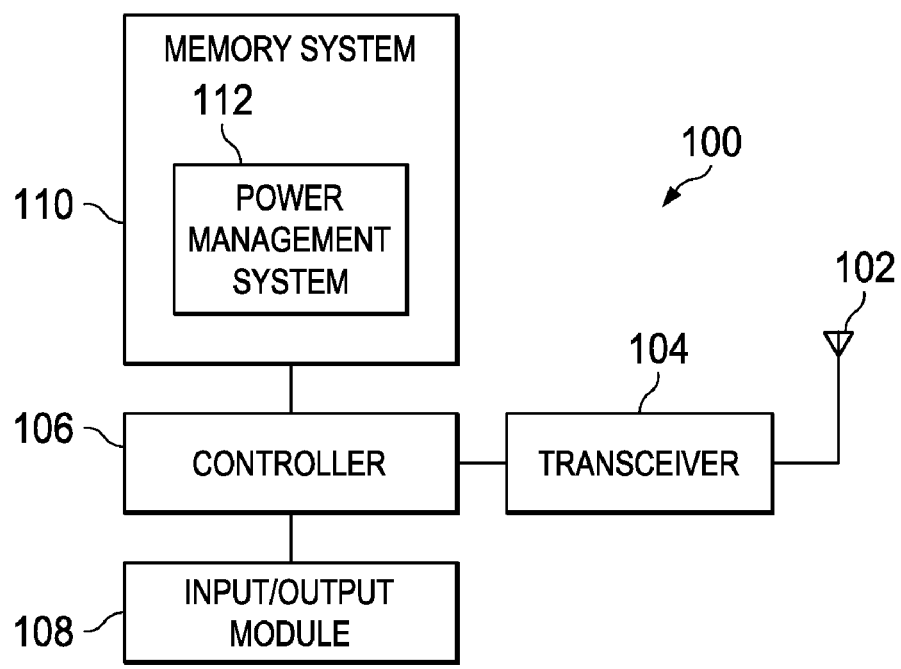
FIG. 3 illustrates a block diagram of a mobile communication device including a memory read system in accordance with an aspect of the invention.

A power management system that is configured to compare a logic voltage with a reference voltage and output the greater of the two in an active mode, such as the power management systems 12 and 50 in the examples of FIGS. 1 and 2, respectively, can be utilized in any of a variety of applications. An example of such an application is depicted in FIG. 3. FIG. 3 illustrates an example of a mobile communication device (MCD) 100, such as a cellular telephone. Wireless signals are transmitted from and received at an antenna 102. The MCD 100 also includes a transceiver 104, a controller 106, and an input/output module 108, which could include a microphone and receiver. Wireless signals received at the antenna 102 are demodulated at the transceiver 104 and sent to the controller 106, such that the signals can be properly interpreted by the controller 106, such as voice data for a user of the MCD 100 at the input/output module 108. Similarly, user voice signals from the input/output module 108 can be sent to the transceiver 104 via the controller 106 to be modulated into a wireless signal that is transmitted from the antenna 102.

The MCD 100 also includes a memory system 110. The memory system could include both volatile and non-volatile memory. The non-volatile memory could include FLASH or other memory that stores information such as stored phone numbers and digital photographs. The volatile memory, which could include one or more memory circuits, could be used to store connection information, such as control information between the MCD 100 and a cell tower that is serving the MCD 100. Accordingly, as it is desirous to maintain high performance and to reduce circuitry overhead to maintain a smaller size of the MCD, the memory within the memory system 110 could include one or more power management systems 112 in accordance with an aspect of the invention. For example, a memory could include one or more memory arrays having a minimum threshold voltage for read/write operations in an active mode. As such, the memory system 110 could include at least one power management system 112 configured to compare a voltage of the peripheral and associated logic circuitry with a reference voltage, and provide an output voltage that is the greater of the two when operating in an active mode. The at least one power management system 112 can also output a retention mode voltage when operating in a retention mode. In addition, the at least one power management system 112 can provide the output voltage by fractionally scaling an existing on-chip voltage potential, thus providing independent voltage potentials to the memory array and associated peripheral and logic circuitry without the need for an additional dedicated power source.

Figure 4:
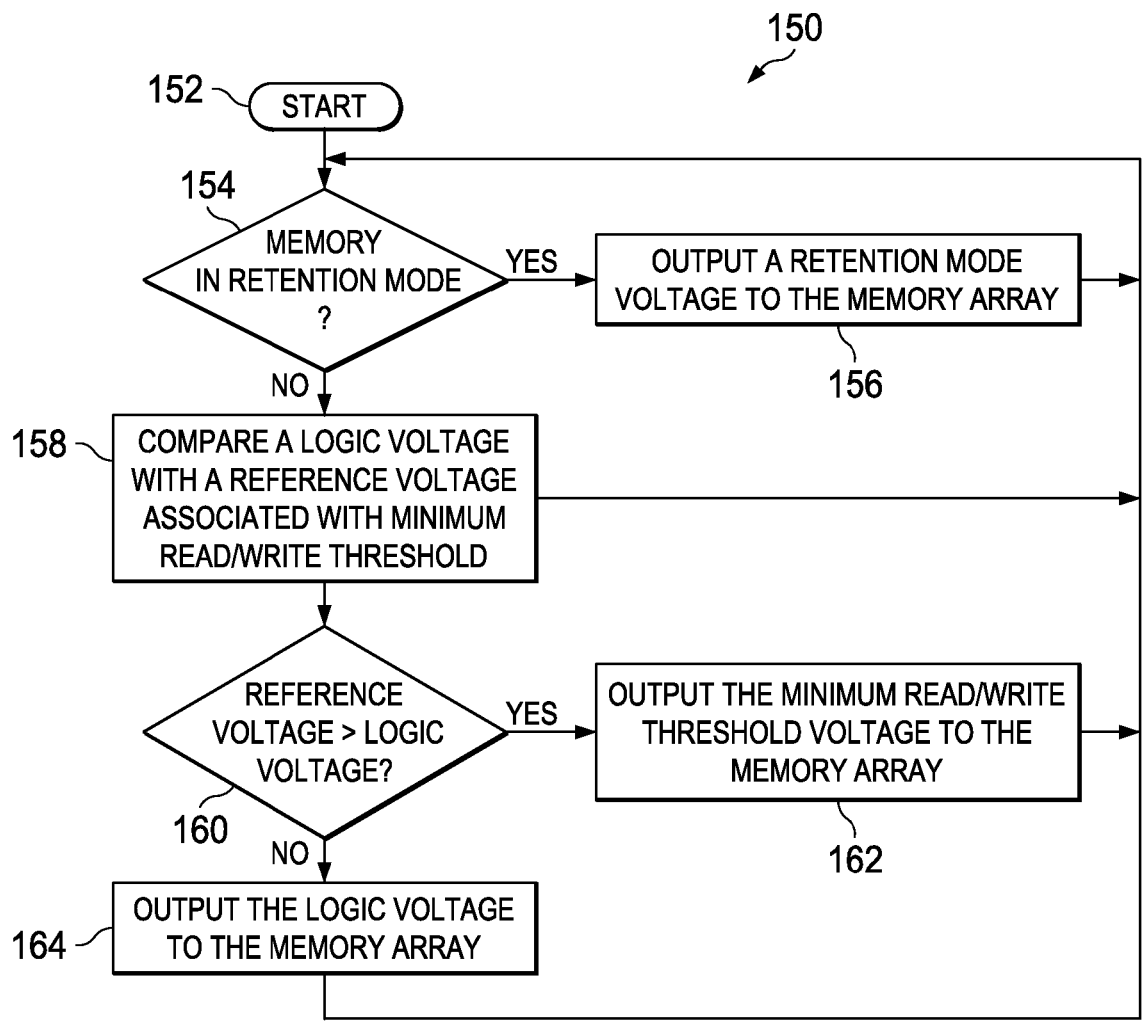
FIG. 4 illustrates a method for managing power in a memory array in accordance with an aspect of the invention.

In view of the foregoing structural and functional features described above, certain methods will be better appreciated with reference to FIG. 4. It is to be understood and appreciated that the illustrated actions, in other embodiments, may occur in different orders and/or concurrently with other actions. Moreover, not all illustrated features may be required to implement a method.

FIG. 4 illustrates a method 150 for managing power for one or more memory arrays in accordance with an aspect of the invention. The method 150 can be implemented in a memory system, such as an SRAM that is included in a mobile communication device. The method begins at 152. At 154, the method proceeds to a decision block that determines whether a power management system is in a retention mode. Upon a YES answer, the method proceeds to 156. At 156, a retention mode voltage is output from the power management system to the memory array. The retention mode voltage can be a voltage that is sufficient to retain data stored in the memory array, but can be less than a minimum threshold voltage required for read/write operations of the memory array. The method then proceeds back to the decision block 154. Upon a NO answer at 154, the power management system is in the active mode, and thus the method proceeds to 158.

At 158, a logic voltage is compared with a reference voltage. The logic voltage can be a power supply voltage to a peripheral circuit and/or associated logic circuitry in the memory circuit. The reference voltage can be a minimum threshold voltage for read/write operations of the memory array. The reference voltage can be a scaled version of the minimum threshold voltage for read/write operations, such that the logic voltage is scaled commensurate with the reference voltage prior to the comparison. At 160, the method proceeds to a decision block regarding whether the reference voltage is greater than the logic voltage.

Upon a YES answer at 160, the reference voltage is greater than the logic voltage, and the method proceeds to 162. At 162, the power management system provides an output to the memory array that is approximately equal to the minimum threshold voltage that is necessary for read/write operations. Thus, the power management system maintains read/write access to the memory array while the logic voltage is at a power saving voltage potential. The minimum threshold voltage can be approximately equal to the reference voltage itself. The method then proceeds back to the decision block 154. Upon a NO answer, the logic voltage is greater than the reference voltage, and the method proceeds to 164. At 164, the power management system provides an output to the memory array that is approximately equal to the logic voltage. Thus, the power management system increases the voltage of the memory array to a voltage commensurate with the logic voltage to provide faster read/write access to the memory array. The method then proceeds back to the decision block 154. Regardless of the voltage output to the memory array, the voltage can be scaled-down from an existing on-chip voltage, such as an I/O voltage of the memory IC.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications, and variations that fall within the spirit and scope of the appended claims.

What is claimed is:

1. A system for managing power of a memory array, the system comprising:
    a comparator configured to compare a first voltage with a reference voltage, the first voltage corresponding to an operating voltage of at least one of a peripheral circuit associated with the memory away and a logic circuit configured to communicate with the peripheral circuit, the reference voltage corresponding to a minimum threshold voltage for read/write operations of the memory array;
    selection circuitry configured to provide a selected signal based on the output of the comparator, the selected signal being the greater of the first voltage and the reference voltage; and
    an output circuit configured to provide an output voltage to the memory array in response to the selected signal, the output voltage being the greater of the operating voltage of the at least one of the peripheral circuit and the logic circuit and the minimum threshold voltage.

2. The system of claim 1, wherein the output circuit comprises a field effect transistor (FET) interconnected between a positive supply voltage and the memory array.

3. The system of claim 2, wherein the positive supply voltage is an input/output supply voltage of an integrated circuit that comprises the memory array.

4. The system of claim 1, wherein the memory array is one of a plurality of memory arrays, and wherein a switch provides the output voltage to the plurality of memory arrays.

5. A mobile communication device comprising the system of claim 1.

6. A system for managing power of a memory array, the system comprising:
    a comparator configured to compare a first voltage with a reference voltage, the first voltage corresponding to an operating voltage of at least one of a peripheral circuit associated with the memory away and a logic circuit configured to communicate with the peripheral circuit, the reference voltage corresponding to a minimum threshold voltage for read/write operations of the memory array; and
    an output circuit configured to provide an output voltage to the memory array in response to an output of the comparator:
    wherein the output circuit is configured to output the greater of the first voltage and the reference voltage to the memory away in an active mode of operation associated with the memory array, and is further configured to output a predetermined voltage in a retention mode of operation associated with the memory array.

7. A system for managing power of a memory array, the system comprising:
    a comparator configured to compare a first voltage with a reference voltage, the first voltage corresponding to an operating voltage of at least one of a peripheral circuit associated with the memory away and a logic circuit configured to communicate with the peripheral circuit, the reference voltage corresponding to a minimum threshold voltage for read/write operations of the memory array; and
    an output circuit configured to provide an output voltage to the memory array in response to an output of the comparator, the output voltage being the greater of the operating voltage of the at least one of the peripheral circuit and the logic circuit and the minimum threshold voltage, wherein the output circuit comprises:
        a field effect transistor (FET) interconnected between a positive supply voltage and the memory array, the positive supply voltage is an input/output supply voltage of an integrated circuit that comprises the memory array; and
        an operational amplifier having a variable output coupled to a gate terminal of the FET, the operational amplifier being configured to control the FET in a substantially linear mode, such that the FET provides the output voltage based on scaling-down the positive supply voltage.

8. The system of claim 7, wherein the operational amplifier provides the variable output based on a first input that is a fractionally scaled version of the greater of the first voltage and the reference voltage and a second input that is a fractionally scaled version of the output voltage.

9. The system of claim 8, wherein the comparator is disabled in response to a retention mode activation signal.

10. A method for managing power of a memory array, the method comprising:

comparing a first voltage with a reference voltage, the first voltage corresponding to an operating voltage of at least one of a peripheral circuit associated with the memory array and a logic circuit configured to communicate with the peripheral circuit, the reference voltage corresponding to a minimum threshold voltage for read/write operations of the memory array;

selecting the greater of the first voltage and the reference voltage in response to the comparison of the first voltage and the reference voltage; and providing a memory supply voltage to the memory array in response to the the selecting of the greater of the first voltage and the reference voltage, the memory supply voltage being the greater of the minimum threshold voltage and the operating voltage of the at least one of the peripheral circuit and the logic circuit.

11. The method of claim 10, further comprising selecting between an active mode of the memory array and a retention mode of the memory array.

12. The method of claim 10, wherein the memory array is one of a plurality of memory arrays, and wherein the providing the memory supply voltage comprises providing the memory supply voltage to the plurality of memory arrays.

13. A mobile communication device configured to implement the method of claim 10.

14. A method for managing power of a memory array, the method comprising:

comparing a first voltage with a reference voltage, the first voltage corresponding to an operating voltage of at least one of a peripheral circuit associated with the memory array and a logic circuit configured to communicate with the peripheral circuit, the reference voltage corresponding to a minimum threshold voltage for read/write operations of the memory array; and providing a memory supply voltage to the memory array in response to the comparison of the first voltage and the reference voltage, the memory supply voltage being the greater of the minimum threshold voltage and the operating voltage of the at least one of the peripheral circuit and the logic circuit;

wherein the providing the memory supply voltage comprises scaling-down a positive supply voltage to a magnitude that is approximately equal to the greater of the minimum threshold voltage and the operating voltage of the at least one of the peripheral circuit and the logic circuit.

15. The method of claim 14, further comprising providing the positive supply voltage from an input/output supply voltage on an integrated circuit that comprises the memory array.

16. The method of claim 14, wherein the scaling-down comprises operating a field effect transistor (FET) in a linear mode based on a variable output of an operational amplifier.

17. The method of claim 16, further comprising providing a first input to the operational amplifier, the first input being a scaled version of the memory supply voltage, and providing a second input to the operational amplifier, the second input being a scaled version of the greater of the first voltage and the reference voltage, the operational amplifier providing a gate voltage to the FET based on the first input and the second input.

18. A method for managing power of a memory array, the method comprising:

comparing a first voltage with a reference voltage, the first voltage corresponding to an operating voltage of at least one of a peripheral circuit associated with the memory array and a logic circuit configured to communicate with the peripheral circuit, the reference voltage corresponding to a minimum threshold voltage for read/write operations of the memory array;

providing a memory supply voltage to the memory array in response to the comparison of the first voltage and the reference voltage, the memory supply voltage being the greater of the minimum threshold voltage and the operating voltage of the at least one of the peripheral circuit and the logic circuit; and selecting between an active mode of the memory array and a retention mode of the memory array;

wherein the providing the memory supply voltage comprises providing the greater of the first voltage and the reference voltage as the memory supply voltage if the active mode is selected, and providing a predetermined voltage as the memory supply voltage if the retention mode is selected.

19. A system for managing power of a memory array, the system comprising:

means for comparing a first voltage with a reference voltage, the first voltage corresponding to an operating voltage of at least one of a peripheral circuit associated with the memory array and a logic circuit configured to communicate with the peripheral circuit, the reference voltage corresponding to a minimum threshold voltage for read/write operations of the memory array;

means for selecting the greater of the first voltage and the reference voltage in response to the means for comparing; and means for providing a memory supply voltage to the memory array in response to the means for selecting, the memory supply voltage being the greater of the minimum threshold voltage and the operating voltage of the at least one of the peripheral circuit and the logic circuit.

20. A system for managing power of a memory array, the system comprising:

means for comparing a first voltage with a reference voltage, the first voltage corresponding to an operating voltage of at least one of a peripheral circuit associated with the memory array and a logic circuit configured to communicate with the peripheral circuit, the reference voltage corresponding to a minimum threshold voltage for read/write operations of the memory array; and means for providing a memory supply voltage to the memory array in response to the means for comparing, the memory supply voltage being the greater of the minimum threshold voltage and the operating voltage of the at least one of the peripheral circuit and the logic circuit;

wherein the positive supply voltage is an input/output supply voltage of an integrated circuit that comprises the memory array, wherein the means for providing the memory supply voltage further comprises means for scaling-down the positive supply voltage to provide the memory supply voltage.

21. A system for managing power of a memory array, the system comprising:

means for comparing a first voltage with a reference voltage, the first voltage corresponding to an operating voltage of at least one of a peripheral circuit associated with the memory array and a logic circuit configured to communicate with the peripheral circuit, the reference voltage corresponding to a minimum threshold voltage for read/write operations of the memory array;

means for providing a memory supply voltage to the memory array in response to the means for comparing, the memory supply voltage being the greater of the minimum threshold voltage and the operating voltage of the at least one of the peripheral circuit and the logic circuit; and means for switching the output voltage to a predetermined voltage in a retention mode, such that the means for providing the output voltage provides the greater of the minimum threshold voltage and the operating voltage of the at least one of the peripheral circuit and the logic circuit in an active mode and provides the predetermined voltage in the retention mode.

* * * * *